United States Patent
Gupta et al.

(10) Patent No.: US 10,079,056 B2
(45) Date of Patent: Sep. 18, 2018

(54) SRAM MEMORY BIT CELL COMPRISING N-TFET AND P-TFET

(71) Applicant: Commissariat A l'Energie Atomique et aux Energies Alternatives, Paris (FR)

(72) Inventors: Navneet Gupta, Grenoble (FR); Adam Makosiej, Grenoble (FR); Costin Anghel, Vanves (FR); Amara Amara, Sceaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/452,783

(22) Filed: Mar. 8, 2017

(65) Prior Publication Data

US 2017/0263308 A1 Sep. 14, 2017

(30) Foreign Application Priority Data

Mar. 11, 2016 (FR) ...................................... 16 52054

(51) Int. Cl.
*G11C 11/419* (2006.01)
*G11C 11/412* (2006.01)
*G11C 13/02* (2006.01)
*G11C 15/04* (2006.01)

(52) U.S. Cl.
CPC .......... *G11C 11/419* (2013.01); *G11C 11/412* (2013.01); *G11C 13/025* (2013.01); *G11C 15/04* (2013.01)

(58) Field of Classification Search
CPC ...... G11C 11/419; G11C 15/04; G11C 11/412
See application file for complete search history.

(56) References Cited

U.S. PATENT DOCUMENTS

| 8,384,122 B1 * | 2/2013 | Hu ...................... H01L 29/7391 257/104 |
| 2002/0054502 A1 | 5/2002 | King |
| 2007/0045741 A1 | 3/2007 | Forbes et al. |

(Continued)

OTHER PUBLICATIONS

U.S. Appl. No. 14/882,611, filed Oct. 14, 2015, Olivier Thomas et al.

(Continued)

*Primary Examiner* — Douglas King
(74) *Attorney, Agent, or Firm* — Oblon, McClelland, Maier & Neustadt, L.L.P.

(57) ABSTRACT

A SRAM memory bit cell is provided that includes a n-TFET and a p-TFET; a storage node formed by the connection of a first electrode of the n-TFET to a first electrode of the p-TFET (drains or sources); and a control circuit able to apply supply voltages on second electrodes of the n-TFET and p-TFET (sources or drains). The control circuit is configured to provide, during a retention mode, supply and bias voltages reverse biasing the n-TFET and p-TFET in a state wherein a conduction current is obtained by band-to-band tunneling in the n-TFET and p TFET. The control circuit is further configured to provide, during a writing of a bit, supply and bias voltages forward biasing the n-TFET and p-TFET and such that one of the n-TFET and p-TFET is in OFF state and that the other of the n-TFET and p-TFET is in ON state.

13 Claims, 8 Drawing Sheets

(56) References Cited

U.S. PATENT DOCUMENTS

| | | | |
|---|---|---|---|
| 2011/0299326 A1 | 12/2011 | Saripalli et al. | |
| 2012/0106236 A1 | 5/2012 | Singh et al. | |
| 2014/0252455 A1* | 9/2014 | Chuang | H01L 27/11 257/329 |
| 2015/0090959 A1* | 4/2015 | Moselund | B82Y 10/00 257/29 |
| 2016/0049187 A1* | 2/2016 | Adachi | G11C 11/412 365/154 |
| 2016/0196870 A1* | 7/2016 | Miyano | G11C 11/419 365/72 |

OTHER PUBLICATIONS

U.S. Appl. No. 15/454,405, filed Mar. 9, 2017, Navneet Gupta et al.
French Preliminary Search Report dated Dec. 23, 2016 in French Application 16 52054, filed on Mar. 11, 2016 ( with English Translation of categories of Cited Documents).
Ming-Long Fan et al. "Investigation of Single-Trap-Induced Random Telegraph Noise for Tunnel FET Based Devices, 8T SRAM Cell, and Sense Amplifiers", Reliability Physics Symposium ( IRPS), 2013, 5 pages.
Costin Anghel et al "30-nm Tunnel FET With Improved Performance and Reduced Ambipolar Current", IEEE Transactions on Electron Devices, vol. 58, No. 6, 2011, 6 pages.
Toshikazu Fukuda et al. "A 7ns-Access-Time 25μW/MHz 128kb SRAM for Low-Power Fast Wake-up MCU in 65nm CMOS with 27fA/b Retention Current", ISSCC 2014, 3 pages.

* cited by examiner

SRAM MEMORY BIT CELL COMPRISING N-TFET AND P-TFET

TECHNICAL FIELD AND PRIOR ART

The invention concerns a new SRAM memory bit cell comprising TFETs (Tunnel Field-Effect Transistors) which is able to address the requirements for ULP (Ultra-Low Power) applications, like IoT (Internet of Things), and advantageously used in a hybrid TFET/CMOS SRAM architecture.

Constant increase in market demand for longer battery life, low cost and better performance particularly for devices in the IoT world forces the development of more energy efficient solutions. Area and power are therefore the two critical design considerations for SoCs (System-On-Chip) targeted for IoT applications. Since in modern SoCs SRAM can dominate the overall power consumption, especially its leakage, SRAM optimization for lower power consumption and reduced area is therefore important in order to maintain long battery life without sacrificing on chip SRAM capacity.

An approach to SRAM power optimization consists in exploring other than CMOS technology solutions for SRAM design. The TFET was proposed as a possible solution to reduce power dissipation. The TFET operates by band-to-band tunneling and therefore the subthreshold slope (S) is not limited to 60 mV/dec as in the case of CMOS. Fabricated TFETs with S as low as 30 mV/dec have already been measured.

Progress on TFET devices has encouraged research on TFET circuits. Part of reports on TFET SRAM cells using 6T, 7T and 8T bit cells revealed difficulties in obtaining sufficient stability in read and write operations. As the stability in both operation modes is inherently low due to the electrical performance of the TFETs, it is difficult to find the best balance between read and write. Moreover, due to the unidirectional TFET behavior, it was necessary to target low-$V_{DD}$ operation resulting in even more difficulty in obtaining sufficient stability margins in active mode.

In the document US 2011/0299326 A1, a 4T-TFET SRAM bit cell is proposed using negative differential resistance (NDR) property of TFETs in reverse bias. However, the architecture proposed in this document suffers from stability and performance issues. In order to maintain data during read operation, read current should be less than the hump current (in pA range) provided by NDR. Such constrain leads to an extremely slow read with the risk of data corruption while executing the operation. Moreover, the TFET transmission gate for data access limits the maximum operating voltage.

DESCRIPTION OF THE INVENTION

Thus there is a need to propose a new SRAM memory bit cell architecture having lower power consumption and supporting a large range of values of supply voltages without impacting data stability.

One embodiment thus proposes a SRAM memory bit cell comprising at least:
  a n-TFET and a p-TFET;
  a storage node formed by the connection of a first electrode of the n-TFET to a first electrode of the p-TFET, the first electrodes being, in a first configuration, the drains of the n-TFET and p-TFET, or, in a second configuration, the sources of the n-TFET and p-TFET;
  a control circuit able to apply supply voltages on second electrodes of the n-TFET and p-TFET, the second electrodes being, in the first configuration, the sources of the n-TFET and p-TFET, or, in the second configuration, the drains of the n-TFET and p-TFET, and bias voltages on the gates of the n-TFET and p-TFET;
wherein the control circuit is configured to provide:
  during a retention of a bit stored in the storage node, supply and bias voltages reverse biasing the n-TFET and p-TFET in a state wherein a current is obtained by band-to-band tunneling;
  during a writing of a bit in the storage node, supply and bias voltages forward biasing the n-TFET and p-TFET and such that one of the n-TFET and p-TFET is in OFF state and that the other of the n-TFET and p-TFET is in ON state.

The SRAM memory bit cell uses NDR (Negative Differential Resistance) property of TFETs in reverse bias during a retention of information.

During a writing operation, because one of the TFET is OFF and the other is ON and both TFETs are forward biased, the leakage are reduced and the energy required by the bit cell is considerably reduced compared to the SRAM memory bit cell of the prior art.

The new SRAM memory bit cell supports aggressive voltage scaling without impacting data stability of the cell, and allows application of performance boosting techniques without impacting cell leakage.

This new SRAM memory bit cell maintains reasonable stability in all operation modes without using any assist technique.

This SRAM memory bit cell is compatible with other CMOS memory components (driver, controller, etc.) for fabrication in a single FDSOI CMOS process.

During a writing of a bit in the storage node, the value of the supply voltage applied on the second electrode of the n-TFET may correspond to the value of the supply voltage applied on the second electrode of the p-TFET during a retention of a bit stored in the storage node, and the value of the supply voltage applied on the second electrode of the p-TFET may correspond to the value of the supply voltage applied on the second electrode of the n-TFET during a retention of a bit stored in the storage node. In such configuration, the supply voltages applied on the TFETs during a writing of bit in the storage node are swapped compared to the supply voltages applied on the TFETs during a retention mode. Thus there is no need to provide different supply voltages values in retention and writing modes.

The control circuit may be able to provide different bias voltages on each of the gates of the n-TFET and p-TFET. This configuration enables to obtain the fastest configuration for a reading and a writing in the cell.

In the second configuration, the control circuit may be able to provide a single bias voltage on the gates of the n-TFET and p-TFET. This configuration enables to reduce the number of different values for the supply voltages and the bias voltage.

The SRAM memory bit cell may further comprise:
  a read port having a first electrode connected to the storage node;
  a read bit line connected to a second electrode of the read port;
  a first read word line connected to a third electrode of the read port;
  and wherein the control circuit may configured to apply a pre-charge voltage on the read bit line and a read control voltage on the first read word line.

In this case, the read port may comprise a first read TFET, the first electrode may correspond to the gate of the first read TFET, the second electrode may correspond to one of the source and drain of the first read TFET and the third electrode may correspond to the other one of the source and drain of the first read TFET. Such read port is advantageously used to avoid, during a read operation, a reading of other SRAM memory bit cells arranged on the same line.

The read port may further comprise a second read TFET having a conductivity opposite to that of the first read TFET (that is first read n-TFET and a second read p-TFET, or a first read p-TFET and a second read n-TFET), wherein the gate of the second read TFET is connected to the storage node, one of the source and drain of the second read TFET is connected to the read bit line and the other one of the source and drain of the second read TFET is connected to a second read word line. In this configuration, the bit cell can be used in a CAM (Content-Addressable Memory).

Another embodiment concerns a SRAM memory array comprising several SRAM memory bit cells as above disclosed, wherein the SRAM memory bit cells are arranged according to an array of several lines and several columns, and wherein:
- each read bit line is common to all SRAM memory bit cells belonging to a same column of the array;
- each read word line is common to all SRAM memory bit cells belonging to a same row of the array;
- when the control circuit is able to provide different bias voltages on each of the gates of the n-TFET and p-TFET, the gates of the n-TFET of all SRAM memory bit cells belonging to a same column of the array are connected together and the gates of the p-TFET of all SRAM memory bit cells belonging to a same column of the array are connected together;
- when the control circuit is able to provide a single bias voltage on the gates of the n-TFET and p-TFET, the gates of the n-TFET and p-TFET of all SRAM memory bit cells belonging to a same column of the array are connected together.

Another embodiment concerns a SRAM memory device comprising several SRAM memory arrays as above described, wherein the control circuit is common to the several SRAM memory arrays and comprises several CMOS transistors.

BRIEF DESCRIPTION OF THE DRAWINGS

This invention will be understood easier in view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily drawn to scale, so as to make the figures more comprehensible.

The different possibilities (alternatives and embodiments) must not be understood to mutually exclude each other and can, thus, be combined with each other.

DETAILED DESCRIPTION OF PARTICULAR EMBODIMENTS

TFETs are reverse-biased p-i-n gated junctions that operate by tunneling effect, in which the electrostatic potential of the intrinsic region is controlled by a gate terminal. The TFETs used in the SRAM memory bit cells described below are calibrated and designed on data similar to that disclosed in the document C. ANGHEL et al., "30-nm Tunnel FET with improved performance and reduce ambipolar current", IEEE Transactions on Electron Devices, 2011.

For example:
- the TFETs are built using Low-k ($SiO_2$) spacers and a High-k ($HfO_2$) gate dielectric;
- the gate and the spacers lengths are 30 nm each;
- the gate dielectric physical thickness is 3 nm;
- the silicon film thickness (tSi) used to form the source, drain and channel regions is 4 nm.

Figure 1:
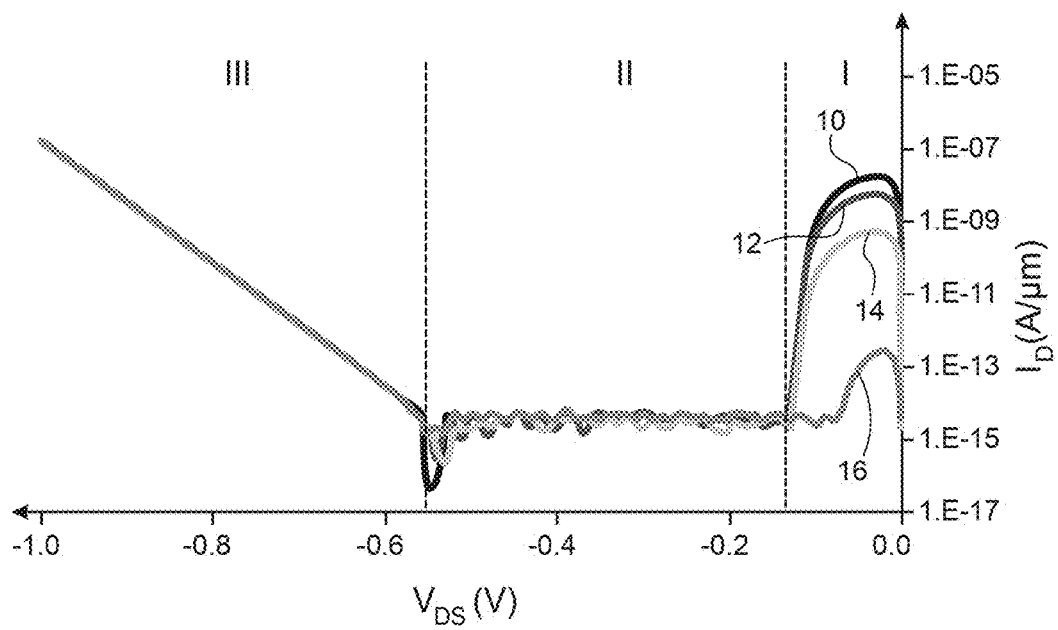
FIG. 1 shows the characteristic $I_D(V_{DS})$ of a reverse biased n-TFET, for different values of $V_{GS}$.
Figures 2A, 2B, 2C:
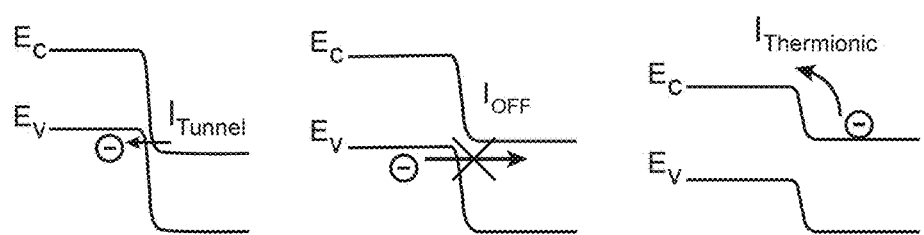
FIGS. 2a-2c show symbolically the different behaviors of a reverse biased TFET.

FIG. 1 shows the characteristic $I_D(V_{DS})$ of a reverse biased n-TFET, for different values of $V_{GS}$: $V_{GS}=1$ V for the curve 10, $V_{GS}=0.75$ V for the curve 12, $V_{GS}=0.5$ V for the curve 14 and $V_{GS}=0.25$ V for the curve 16. For this characteristic, three regions corresponding to three different behaviors of the TFET can be distinguished as follows:

Region I, which is named the "hump", wherein a conduction current $I_{Tunnel}$ is obtained in the TFET by band-to-band tunneling (the charge injection mechanism corresponding to the band-to-band tunneling is symbolically shown in FIG. 2a);

Region II, which is named the "flat-current region", wherein the conduction current obtained in the region I is no longer obtained due to the non-overlapping bands (as shown symbolically in FIG. 2b);

Region III, which is named the "p-i-n turn-on", wherein the charge injection mechanism is dominated by the thermionic emission over the barrier, creating a current named $I_{Thermionic}$ as shown symbolically in FIG. 2c. In this region III, the TFET has a behavior similar to a short-circuit.

For the region III, the reverse biased output characteristic is named "unidirectional" due to the fact that the gate loses the control over the TFET for high negative drain voltages.

In the SRAM memory bit cell described here, TFETs are not reverse biased with high negative $V_{DS}$ for n-TFET (and high-positive $V_{DS}$ for p-TFET) to avoid high leakage currents obtained in the region III, that is when the TFETs have a "p-i-n turn on" behavior.

Figure 3:
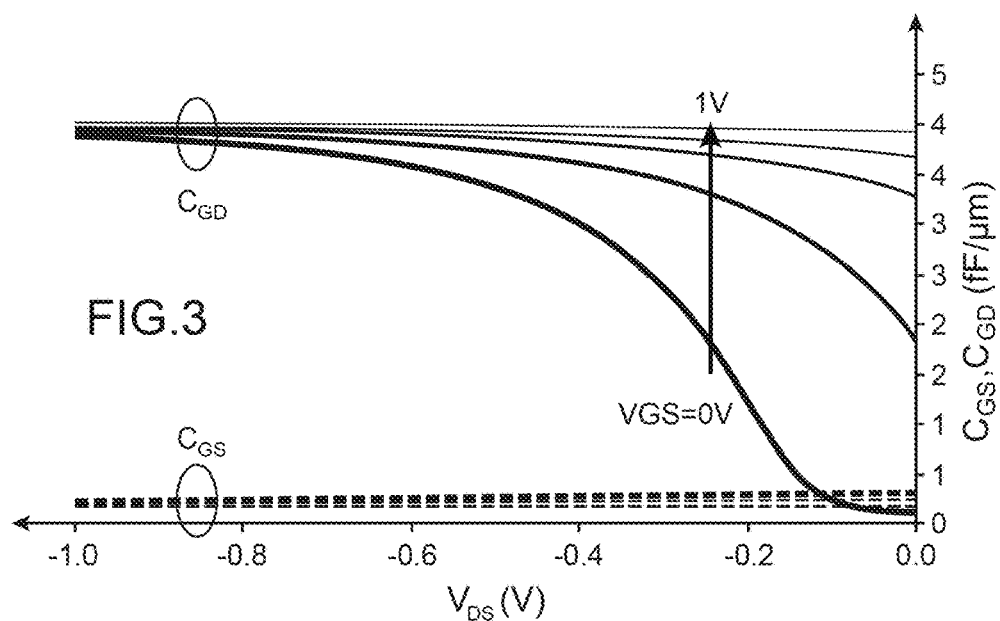
FIG. 3 shows TFET gate to source ($C_{GS}$) and gate to drain ($C_{GD}$) capacitances according to $V_{DS}$, obtained for different values of $V_{GS}$.

TFET gate to source ($C_{GS}$) and gate to drain ($C_{GD}$) capacitances are shown in FIG. 3. The $C_{GS}$ for TFETs is always low and has weak dependence on gate voltage. The total gate capacitance is dominated by $C_{GD}$.

For the following circuit simulations, both p-TFET and n-TFET are modelled using look-up tables. Both DC and capacitance characteristics were implemented as $I_D(V_{GS}, V_{DS})$, $C_{GS}(V_{GS}, V_{DS})$, $C_{GD}(V_{GS}, V_{DS})$ tables.

Figure 4:
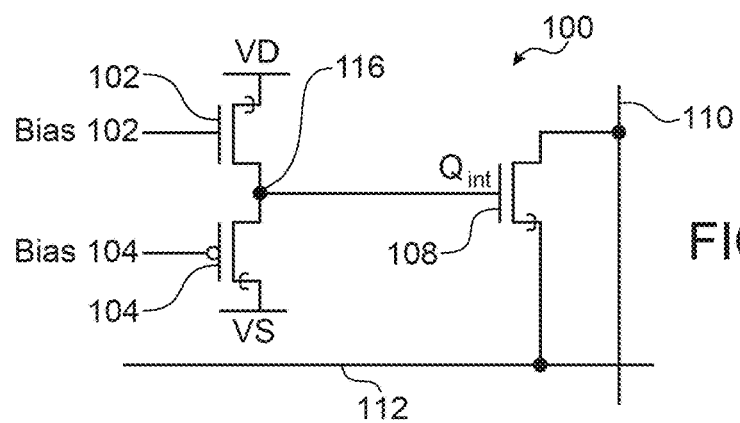
FIG. 4 shows a SRAM memory bit cell according to a first embodiment.

A SRAM memory bit cell 100 according to a first embodiment is shown in FIG. 4 and described below.

The cell 100 comprises a n-TFET 102 and a p-TFET 104. The drains of the n-TFET 102 and p-TFET 104 are connected one to the other and form a storage node 106 of the cell 100. The electric potential in the storage node 106 is named "Qint".

The TFETs 102, 104 are biased by a first supply voltage $V_D$ applied on the source of the n-TFET 102 and a second supply voltage $V_S$ applied on the source of the p-TFET 104.

Two different bias voltages are applied on the gates of the TFETs 102, 104: Bias102 is applied on the gate of the n-TFET 102 and Bias104 is applied on the gate of the p-TFET 104.

The cell 100, which is intended to be used in an array of bit cells, also comprises a read TFET 108, here n-type, having its drain connected to a Read Bit Line (RBL) 110 and its source connected to a Read Word Line (RWL) 112.

During a retention mode of the cell 100, TFETs 102, 104 are reverse biased with $0<V_D-V_S$. In addition, $V_D$ and $V_S$ are such that $V_D-V_S<0.6$ V (because in the TFETs used in the example described here, the limit between the regions II and III in reverse biasing is located at $V_{DS}$ equal to around $-0.6$ V for n-TFET and 0.6 V for p-TFET). The bias voltages Bias102 and Bias104 are defined such that both n-TFET 102 and p-TFET 104 get sufficient gate drive for hump, that is such that $V_{GS}$ is enough to have a current created by band-to-band tunneling when these TFETs operate in the region I of the reverse bias characteristic.

In the example below, $V_S=0$ V (ground) and $V_D=0.6$ V.

Figure 5:
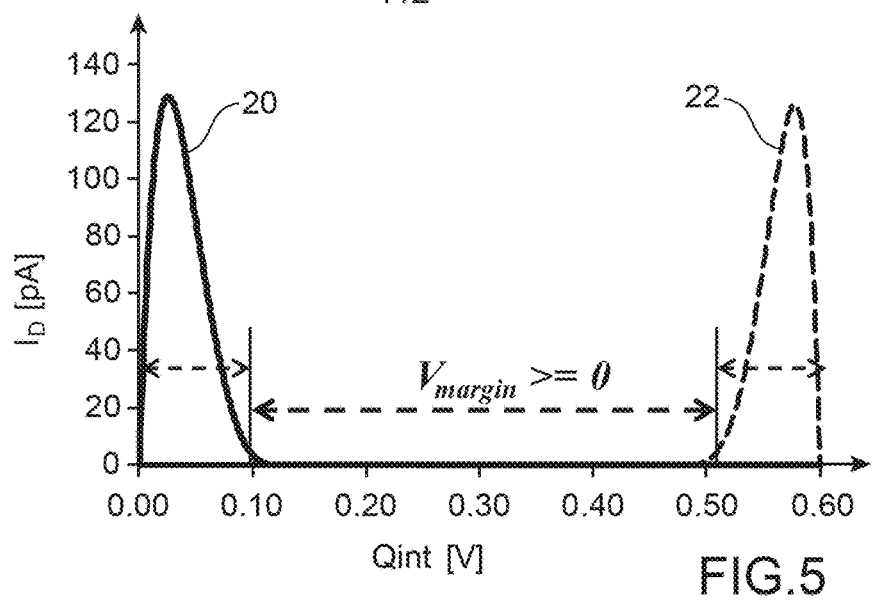
FIG. 5 shows the characteristic $I_D(V_{Qint})$ with reverse bias $V_{DS}$ for the n-TFET and the p-TFET of the cell.

The characteristic $I_D(V_{Qint})$ with reverse bias $V_{DS}$ for the n-TFET 102 (curve 22) and the p-TFET 104 (curve 20) of the cell 100 is shown in FIG. 5, with $V_D-V_S=0.6$ V (for example obtained with $V_S=0$ V and $V_D=0.6$ V). This characteristic shows that reverse biased n-TFET 102 and p-TFET 104 with such supply voltages have a behavior similar to a latch behavior, with the condition that the total cell supply ($V_D-V_S$) is less than the critical point where the TFET current becomes independent of gate voltage (corresponding to the region III shown in FIG. 1 where the charge injection mechanisms in the TFET are dominated by thermionic emission over the barrier). In the example described here, this point is equal to around 0.6 V. Thus, if $V_S=0$ V, $V_D$ is chosen ≤0.6 V.

Since the p-TFET 104 conducts when $V_{Qint}$ is close to $V_S$ and n-TFET 102 conducts when $V_{Qint}$ is close to $V_D$, '0' value is stored in the cell 100 on the p-TFET 104, with the n-TFET 102 in OFF state in this case, and '1' value is stored in the cell 100 on the n-TFET 102, with the p-TFET 104 in OFF state in this case. For a cell supply ($V_D-V_S$) of 0.6 V, the storage node 106 is discharged through the p-TFET 104 for 0<Qint<100 mV (range corresponding to the width of the hump, region I, of the characteristic $I_D(V_{DS})$ of the p-TFET 104) till Qint=Vs, that is here Qint=0 V. Similarly, Qint will be charged to the value of $V_D$ by the n-TFET 102 for 0.5 V<Qint<0.6 V (range corresponding to the width of the hump, region I, of the characteristic $I_D(V_{DS})$ of the n-TFET 104).

The distance between the two humps of the characteristics $I_D(V_{DS})$ of the TFETs 102, 104 is called $V_{Margin}$ and corresponds to the voltage range for which the cell 100 is metastable. Here, the features of TFETs 102, 104 and the values of $V_D$ and $V_S$ are such that $V_{Margin} \geq 0$.

The current peak value obtained at the top of the humps of the characteristics $I_D(V_{DS})$ of the TFETs 102, 104 varies with the applied gate voltage (Bias102 and Bias104) but the width of the hump remains fairly independent of gate voltage, as shown in FIG. 1.

The stability constraints for the cell 100 are significantly different from conventional 6T-SRAM cell because the data storage node 106 is not isolated in all operating conditions except only when it is written. Therefore, stability during read/write operation is similar to static noise margin of the cell. This results in weak dependence of cell static noise margin on cell supply voltage. In the example here described, this cell 100 has static noise margin of 100 mV (width of current hump) for $V_{Margin} \geq 0$, that is when $V_D-V_S$ is between 0.2 V and 0.6 V.

Thus, during the retention mode, the voltages $V_D$, $V_S$, Bias102, and Bias104 are such that $V_{GS\_102}>0$, $V_{DS\_102} \leq 0$, $V_{GS\_104}<0$ and $V_{DS\_104} \geq 0$.

For writing in this cell 100, both n-TFET 102 and p-TFET 104 are forward biased by changing $V_D$ and $V_S$, for example by switching their values, such that the TFETs 102, 104 behave like FETs, and control the gate bias to switch off either p-TFET 104 or n-TFET 102 depending on the value to be written in the cell 100.

For writing in the cell 100, $V_D$ and $V_S$ voltages are swapped to make $V_S>V_D$, both TFETS 102, 104 being thus forward biased. For writing '0' in the node 106, Bias104 is pulled up to reduce the gate drive of the p-TFET 104 and Bias102 remains the same as during the retention mode. Thus, the n-TFET 102 will discharge the node 106 to voltage on $V_D$. Similarly, for writing '1' in the node 106, Bias102 is pulled down to reduce gate drive of the n-TFET 102 and Bias104 remains same as during the retention mode. Therefore, the p-TFET 104 will charge the node 106 to the voltage on $V_S$.

Figure 6:
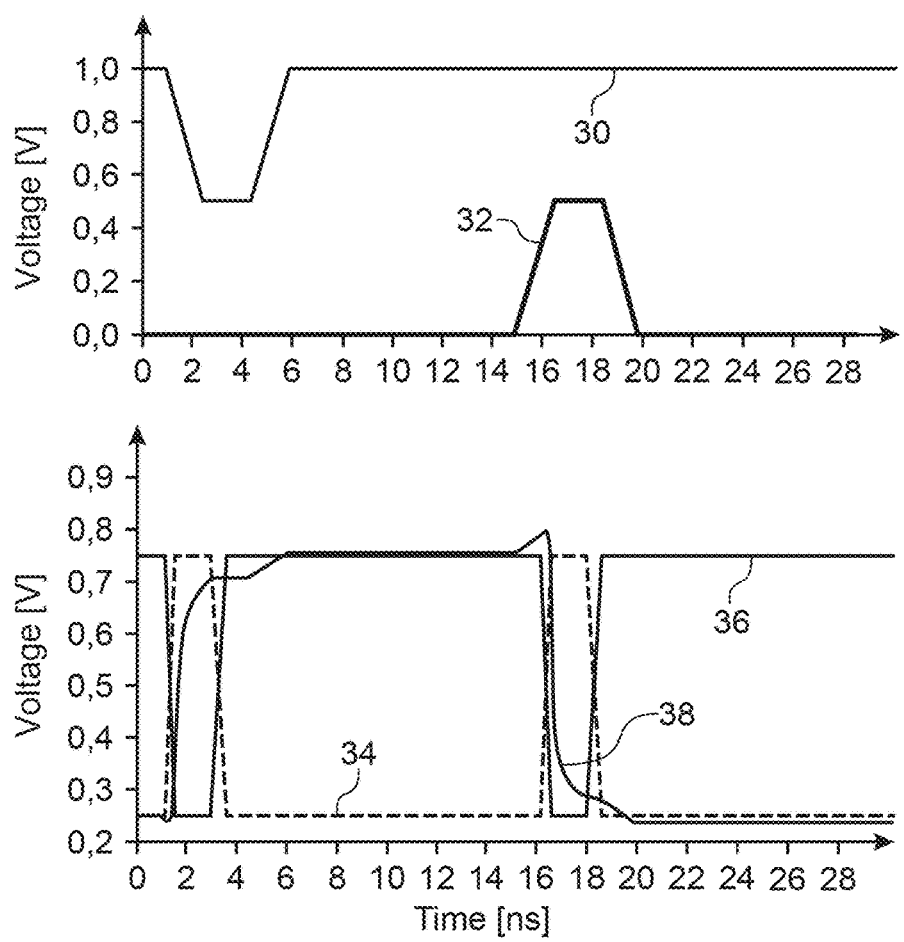
FIG. 6 shows waveforms of signals of the SRAM memory bit cell according to the first embodiment and during writing operations.

Example waveforms for writing '1' and then writing '0' in the storage node 106 of the cell 100 are shown in FIG. 6. The reference 30 designates the bias voltage Bias102, the reference 32 designates the bias voltage Bias104, the reference 34 designates the supply voltage $V_S$ (shown with dotted line), the reference 36 designates the supply voltage $V_D$, and the reference 38 designates the potential $V_{Qint}$ obtained in the storage node 106.

Thus, during a writing of '0' in the node 106, the voltages $V_D$, $V_S$, Bias102, and Bias104 are such that $V_{GS\_102}>0$, $I_{D\_102}=I_{ON\_102}$ (with $I_{ON\_102}$ corresponding to the ON current of the n-TFET 102), $V_{GS\_104}-V_{OFF\_104}$ (with $V_{OFF\_104}$ corresponding to the $V_{OFF}$ of the p-TFET 104, that is the $V_{GS}$ value for which the device starts to conduct. $V_{OFF}$ value is directly dependent on technology parameters and can by adjusted by modifying parameters such as doping, gate workfunction, physical dimensions, material, etc.) close to 0 but not equal to 0 and with $V_{GS\_104} > V_{OFF\_104}$, and $I_{D\_104}$ is positive and close to 0 (but not equal to 0). During a writing of '1' in the node 106, the voltages $V_D$, $V_S$, Bias102, and Bias104 are such that $V_{GS\_102} - V_{OFF\_102}$ (with $V_{OFF\_102}$ corresponding to the $V_{OFF}$ of the n-TFET 102) is close to 0 but not equal to 0 and with $V_{GS\_102} > V_{OFF\_102}$, $I_{D\_102} = 0$, $V_{GS\_104} < 0$ and $I_{D\_104} = I_{ON\_104}$ (with $I_{ON\_104}$ corresponding to the ON current of the p-TFET 104).

A read operation is done using single ended read scheme with RWL 112 and RBL 110. RWL 112 selects the row of the array of bit cells to be read. RBL 110 is either discharged or remains on a pre-charged value. RBL can fully discharge or a single-ended sense amplifier can be used. Full discharge is preferable for low voltage operation and to maintain the column pitch for reading circuit. The sense amplifier may be an inverter with skewed threshold voltage. In order to read correctly, at least 50% of supply voltage discharge is preferably applied for RBL 110.

Figure 7:
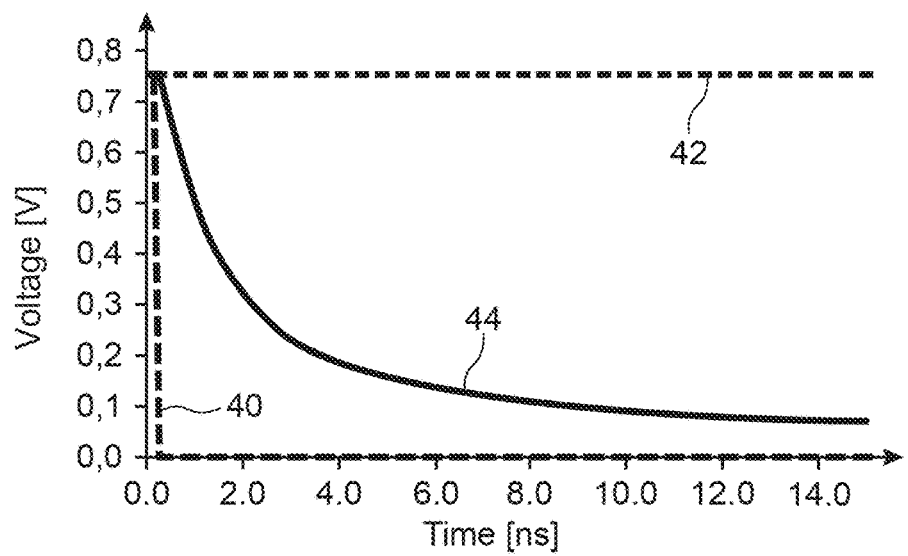
FIG. 7 shows waveforms of signals of the SRAM memory bit cell during a reading operation.

Example waveforms for a read operation is shown in FIG. 7, for reading the value stored in the node 106 of the cell 100. For such reading, the value of the voltage applied on the RWL 112 is changed from a value corresponding that of a stored bit '1', equals to $V_D$ (e.g. 0.75 V on FIG. 7), to a value corresponding to that of a stored bit '0', e.g. 0 V (curve 40). If a value '0' is stored in the storage node 106, the value of the voltage on the RBL 110 remains at a value corresponding to a '1' (curve 42). If a value '1' is stored in the storage node 106, the value of the voltage on the RBL 110 goes to '0' (curve 44).

If the read TFET 108 corresponds to a p-TFET, curve 42 applies for a value '1' stored in the storage node 106 and curve 44 applies for a value '0' stored in the storage node 106. With such read p-TFET, the RBL 110 is pre-charged with a value corresponding to '0', the value applied on RWL 112 is '0' during a retention, and the value applied on RWL 112 is '1' during a read.

In view of the above described behavior of the cell 100, the operating of the cell 100 in the different modes (retention, write and read) needs the use of five different voltage values to be used for $V_D$, $V_S$, Bias102 and Bias104. These values may be named GND, VDDL, VDD, VDDH and 2VDD (that is 2*VDD) and are such that:

GND<VDDL<VDD<VDDH<2VDD.

It is possible that the value 2VDD does not correspond to 2*VDD but to any value higher than VDDH.

The use of these five values for the different voltages of the cell 100 during retention, read and write operations are shown in the table below.

|  | $V_D$ | $V_S$ | RWL 112 | RBL 110 | Bias104 | Bias102 |
|---|---|---|---|---|---|---|
| Retention | VDDH | VDDL | VDDH | VDDH | GND | 2VDD |
| Write-1 | VDDL | VDDL | VDDH | VDDH | GND | VDD |
| Write-0 | VDDL | VDDL | VDDH | VDDH | VDD | 2VDD |
| Read | VDDH | VDDL | GND | VDDH | GND | 2VDD |

As an example, these values may be such that:

| GND | VDDL | VDD | VDDH | 2VDD |
|---|---|---|---|---|
| 0 V | 0.25 V | 0.5 V | 0.75 V | 1 V |

Figure 8:
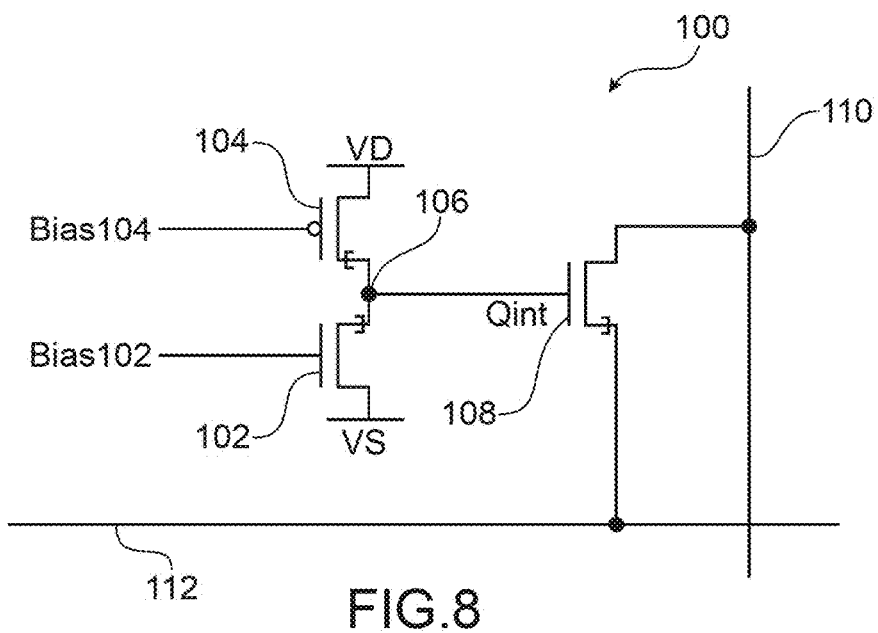
FIG. 8 shows a SRAM memory bit cell according to a variant of the first embodiment.

A SRAM memory bit cell 100 according to a variant of the first embodiment is shown in FIG. 8.

According to this variant, the supply voltage $V_D$ is applied on the drain of the p-TFET 104 and the supply voltage $V_S$ is applied on the drain of the n-TFET 102. The sources of the n-TFET 102 and of the p-TFET 104 are linked to the storage node 106 of the cell 100.

The behavior of the cell 100 according to this variant is close to that of the cell 100 previously described.

During the retention mode, the voltages $V_D$, $V_S$, Bias102, and Bias104 applied in the cell 100 according to this variant are such that $V_{GS\_102} \geq 0$, $V_{DS\_102} \leq 0$, $V_{GS\_104} \leq 0$ and $V_{DS\_104} \geq 0$.

During a writing of '0' in the storage node 106, the values of voltages $V_D$, $V_S$, Bias102, and Bias104 are such that $V_{GS\_102} - V_{OFF\_102}$ is close to 0 but not equal to 0 and with $V_{GS\_102} > V_{OFF\_102}$, $I_{D\_102}$ is positive and close to 0, $V_{GS\_104} \leq 0$ and $I_{D\_104} = I_{ON\_104}$. During a writing of '1' in the storage node 106, the values of the voltages $V_D$, $V_S$, Bias102, and Bias104 are such that $V_{GS\_102} > 0$, $I_{D\_102}$ is close to $I_{ON\_102}$, $V_{GS\_104} - V_{OFF\_104}$ is close to 0 but not equal to 0 and with $V_{GS\_104} < V_{OFF\_104}$, and $I_{D\_104}$ is positive and close to 0.

The cell 100 previously described in relation with the FIG. 4 provides high write speed and low capacitance on supply nodes (on which $V_D$ and $V_S$ are applied) because of low $C_{GS}$ in TFETs 102, 104 and constant $V_{GS}$ during write for TFETs 102, 104. In the cell shown in FIG. 8, $V_{GS}$ of TFETs 102, 104 is continuously changing with the value of Qint during write operation because of the sources of the TFETs 102, 104 connected to the storage node 106. Thus the write speed of the cell 100 of FIG. 8 is less than that of the cell 100 of FIG. 4. However, the cell 100 according to the variant shown in FIG. 8 is better in terms of stability because of higher hump current due to higher $V_{GS}$ for TFETs 102, 104 during retention mode.

Figure 9:
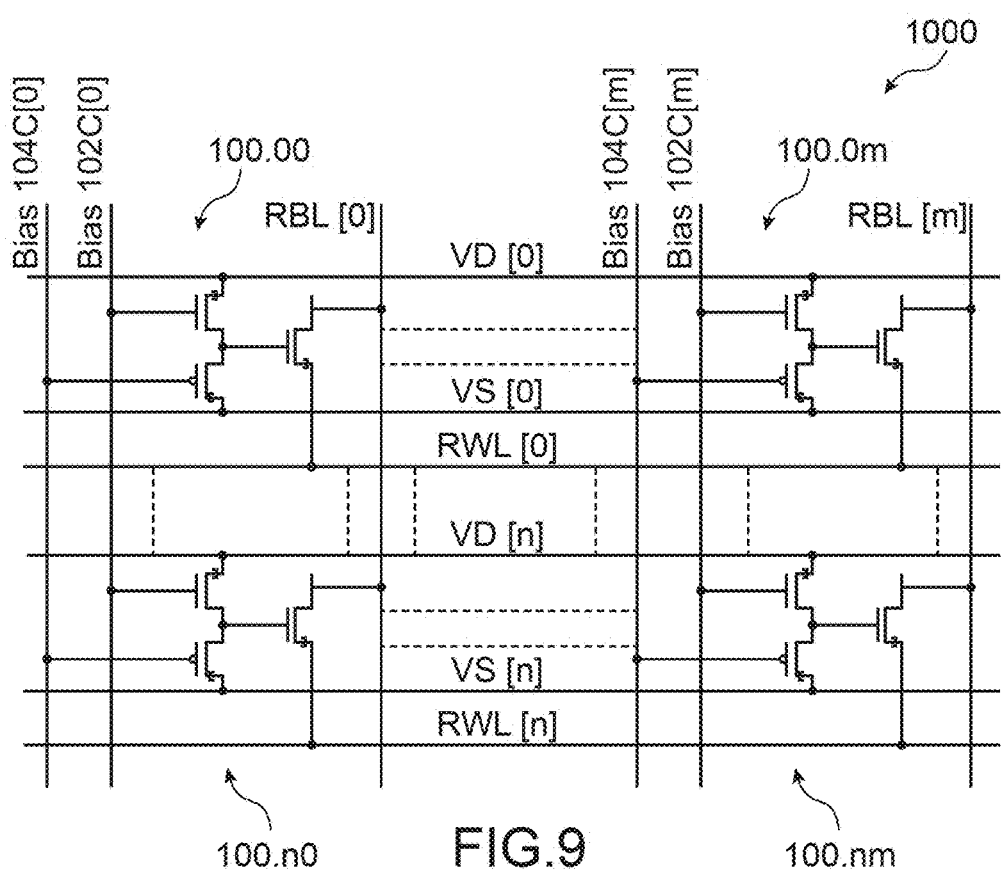
FIG. 9 shows a SRAM memory bit cells array according to a particular embodiment.

The cell 100 of the FIG. 4 or of the FIG. 8 is intended to be coupled with several other similar cells 100 to form a SRAM memory bit cells array 1000 as shown in FIG. 9.

FIG. 9 shows the array 1000 organization including routing of signals. The memory bit cells array comprises here n lines and m columns of n×m cells 100.00 to 100.nm. Data words are stored horizontally. $V_D$ and $V_S$ are routed horizontally to align with the data word, and are common to all bit cells arranged in a same line of the array. Bias102 and Bias104 are routed vertically, that is are common to all bit cells arranged in a same column of the array. In this architecture, selection of the row to be written is done by choosing the values of $V_D$ and $V_S$ of each line of the array, and the value to be written in each cell 100 is decided by the values of Bias102 and Bias104 of each column. Selection of row to be read is done by the values applied on RWL 112 of each line of the array 1000 and data is read using RBL 110.

Figure 10:
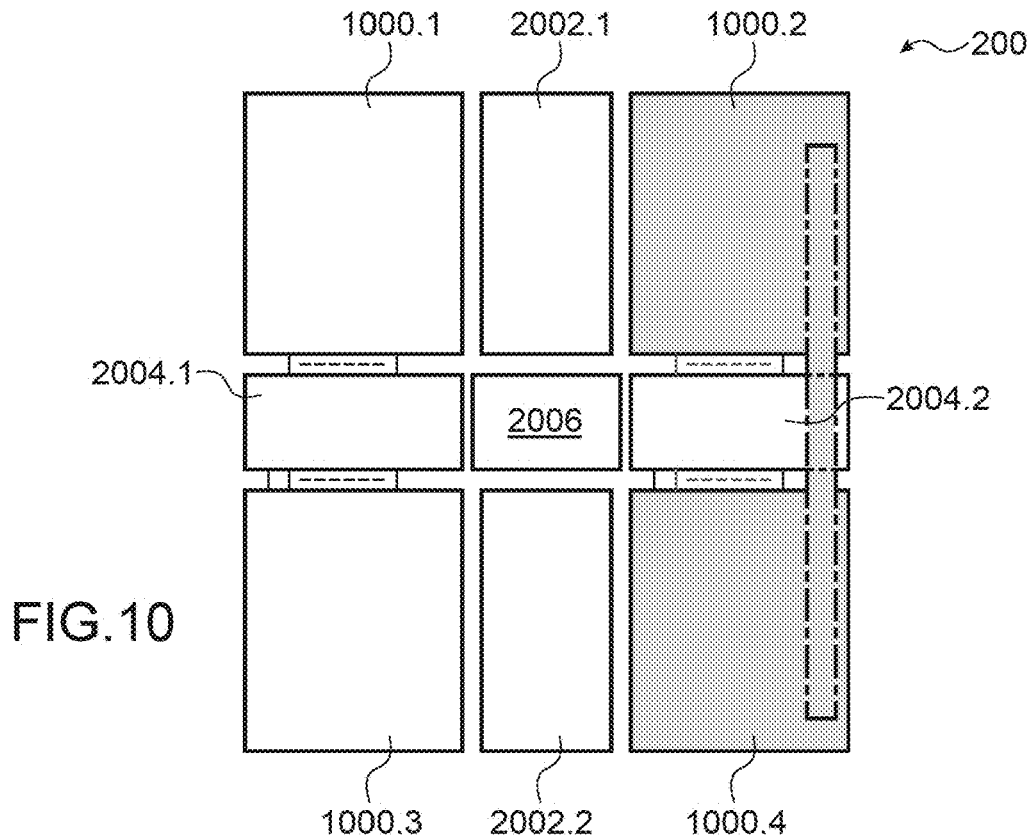
FIG. 10 shows a SRAM memory device according to a particular embodiment.

Proposed SRAM memory device 2000 is shown in FIG. 10. The memory device 2000 includes four TFET SRAM arrays of 64×32 bit cells (references 1000.1-1000.4, each one including 64 lines of 32 bit cells 100), two Word Line drivers 2002.1 and 2002.2 used to control the values applied on the RWL 112, $V_D$ and $V_S$, two I/O Logic 2004.1 and 2004.2 used to control the values applied on the RBL 110 and the values of Bias102 and Bias104 and to sense the values on RBL 110 using sense amplifier to provide data output during read operation, and a controller 2006 controlling the operating of the memory device 2000.

In order to optimize the cell array leakage current, bit cells arrays 1000 are advantageously designed fully with TFETs. The other elements of the memory device 2000 may be designed using CMOS to optimize area for the same speed of operation in comparison to TFETs because of higher drive strength. Single ended sense amplifier may be used to limit the bitline discharge to reduce power consumption and to allow bigger column size.

With the bit cells 100 previously described, a bit cells array of 64×32 (2 Kb) size may be done with a cell size equal to 0.1266 µm²/bit with standard logic design rules.

In each bit cell 100, the TFET 108 (200 nm) on read port may be twice the size of TFETs 102, 104 (100 nm). This improves the read speed of the design.

In order to have optimized rectangular layout of the bit cells, two bit cells may be combined together in layout to have six transistors. Because of the reduced cell width, the wiring capacitances on the various horizontal lines in the bit cells array are reduced. The extracted values of wiring capacitances form the layout are 50% in comparison to the same size of memory designed using compact 6T-SRAM cell.

Due to the low bit cell capacitance and low $C_{GS}$ capacitance of TFET devices, the total capacitance of supply nodes on which the voltages $V_D$ and $V_S$ are applied and of RWL 112 are less than half with respect to standard 6T-CMOS. This results in drivers (for RWL 112, $V_D$ and $V_S$) with less leakage for same specification of transition time and word size.

For the proposed design, energy consumption is computed with the following assumptions: for average energy ($E_{AVG}$) computation, during read, 50% of data are '0' and 50% are '1'; and 50% operations are read and 50% are write. Overall comparison of energy consumption in various modes and bit cell area is shown in the table below (these values are experimental results specific to a technology, design rules and design, and may change for different sizing, technology and design rules).

| Cell | VDD (V) | WL$_{pulse}$ Read (ns) | WL$_{pulse}$ Write (ns) | E$_{READ}$ (fJ/acc.) | E$_{WRITE}$ (fJ/acc.) | E$_{AVG}$ (fJ/acc.) |
|---|---|---|---|---|---|---|
| 8T-TFET | 1 | 0.26 | 1.10 | 28.5 | 61.0 | 44.8 |
| 3T-TFET 100 | 0.6 | 0.21 | 0.93 | 1.81 | 4.99 | 3.4 |
| 6T-CMOS | 1.2 | 7 ns (access time for the full memory) | | N.A. | N.A. | 25 µW/MHz |

| Cell | I$_{LEAK}$ Active (pA/bit) | I$_{LEAK}$ STBY (pA/bit) | Area/Bitcell (µm²) |
|---|---|---|---|
| 8T-TFET | 25.5 | 5.00 | 0.336 |
| 3T-TFET 100 | 5.72 | 0.35 | 0.1266 |
| 6T-CMOS | N.A. | 27.0 | 2.04 |

The 8T-TFET cell corresponds to the one described in the document A. Makosiej et al., "A 32 nm Tunnel FET SRAM for Ultra Low Leakage", ISCAS, 2012. The 6T-CMOS cell corresponds to the one described in the document Toshikazu Fukuda, Koji Kohara et al. "A 7 ns-Access-Time 25 µW/MHz 128 kb SRAM for Low-Power Fast Wake-Up MCU in 65 nm CMOS with 27 fA/b Retention Current", ISSCC 2014.

$E_{READ}$ is the energy consumed during read on row drivers and bitlines. Read Bitline discharge is limited to 50% of supply (200 mV) for 3T-TFET and 8T-TFET SRAMs because they use single ended sensing. Read Bitline discharge is limited to 100 mV for 6T-SRAM with differential read. $E_{WRITE}$ is the energy consumed during write operation. $I_{LEAK}$ in active mode is total leakage in bit cells array and periphery with dynamic power gating implementation (only 25% of the drivers are switched ON depending on the accessed address). $I_{LEAK}$ in standby mode is computed with periphery OFF and cell array power ON to retain the data.

The leakage power consumption of wordline drivers for the 3T-TFET cell 100 has been compared with 6T-SRAM and 8T-TFET SRAM cells for same transition time specification. Bit cell 100 array leakage is 10⁴× and 77× lower in comparison to 6T-CMOS (1) and 6T-CMOS (2) cells, respectively. Bit cell 100 leakage is 14× lower in comparison to 8T-TFET SRAM cells. During standby, total leakage is coming from cell array, thus TFET memory leakage is much lower than CMOS memories. Overall memory leakage during active mode, including bit cells and drivers, for proposed design is 52% less than 6T-CMOS and 77% less than 8T-TFET SRAMs.

Because of low capacitance on supply nodes (on which $V_D$ and $V_S$ are applied) and on RWL 112, dynamic power consumption of the cell 100 is 70% less in comparison to 6T-CMOS SRAM and up-to 90% less in comparison to 8T-TFET SRAM.

Figure 11:
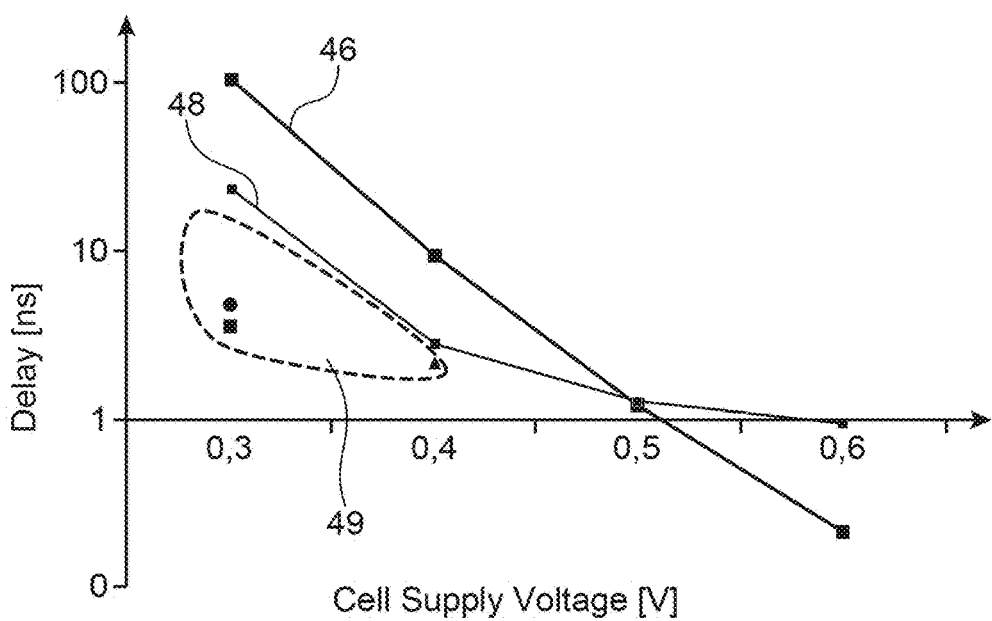
FIG. 11 shows the read and write performances of a SRAM memory bit cell according to the first embodiment.

Read (reference 46) and write (reference 48) minimum wordline pulse width (WLP$_{crit}$) is shown in FIG. 11. For the full range of operation cell leakage is <0.35 fA/bit because TFETs 102, 104 are in reverse bias. As shown in FIG. 11, the read/write speed can be increased by using assist techniques for low voltage operation (see results surrounded by dotted lines 49). Since the cell data storage node 106 is isolated from RBL 110 and bias voltages of TFETs 102, 104, negative wordline (NWL) can be used to increase read speed without impacting the cell stability. Similarly for write, speed can be increased without degrading cell stability by boosting bias voltages (Bias102 and Bias104). Read performance is improved by 29×, by using negative wordline (RWL) with −100 mV and −150 mV for 0.4 V and 0.3 V supplies, respectively. Similar for write, with a boost of 100 mV on bias voltage results in 4.8× improvement at 0.3V cell supply.

Minimum read and write access pulse is evaluated at 1.27 ns at sub-1V supply voltage.

Overall performance is estimated including periphery delays in row decoder, drivers and sensing. Proposed design supports overall read speed from 1.92 GHz to 3.82 MHz and write speed from 429 MHz to 17.3 MHz for 0.6 V to 0.3 V on cell supply, with Bias102 and Bias104 from 1.2 V to 0.6 V. This includes, overall five voltages (previously named GND, VDDL, VDD, VDDH, 2VDD). This can be implemented either with five different voltage supplies or three different voltage supplies with two voltage dividers.

Figure 12:
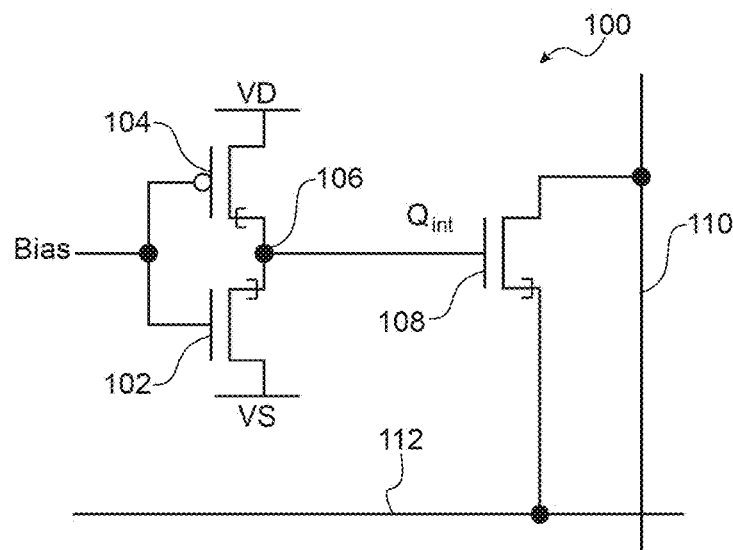
FIG. 12 shows a SRAM memory bit cell according to a second embodiment.

A SRAM memory bit cell 100 according to a second embodiment is now described in relation with the FIG. 12.

Figure 13:
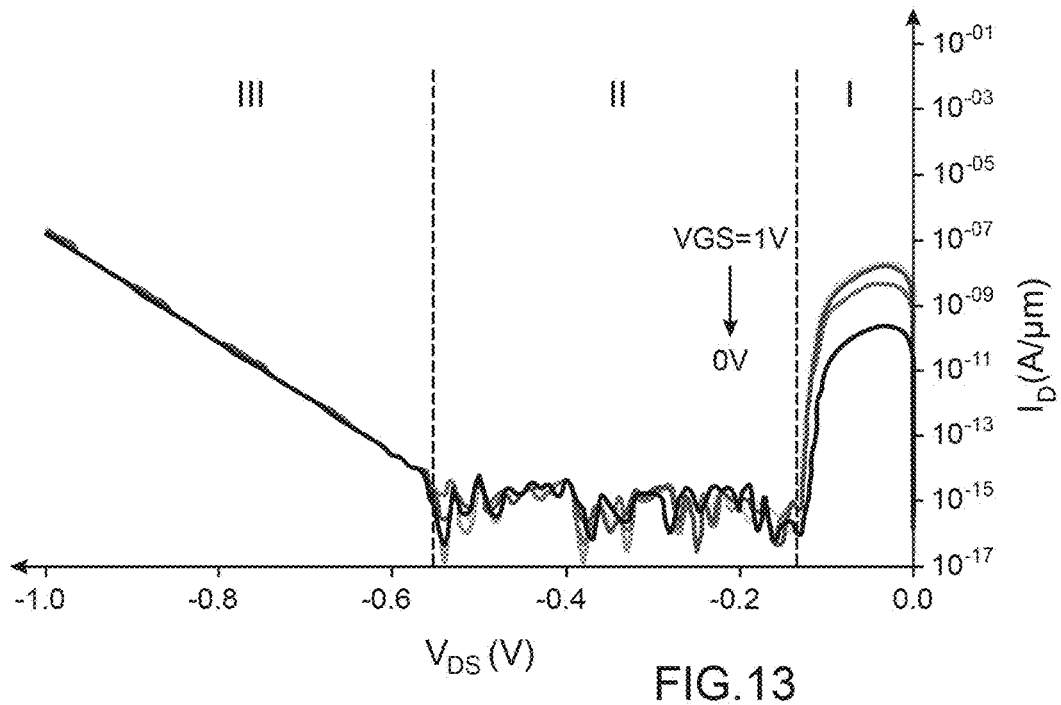
FIG. 13 shows the characteristic $I_D(V_{DS})$ of a reverse biased n-TFET, for different values of $V_{GS}$.
Figure 14:
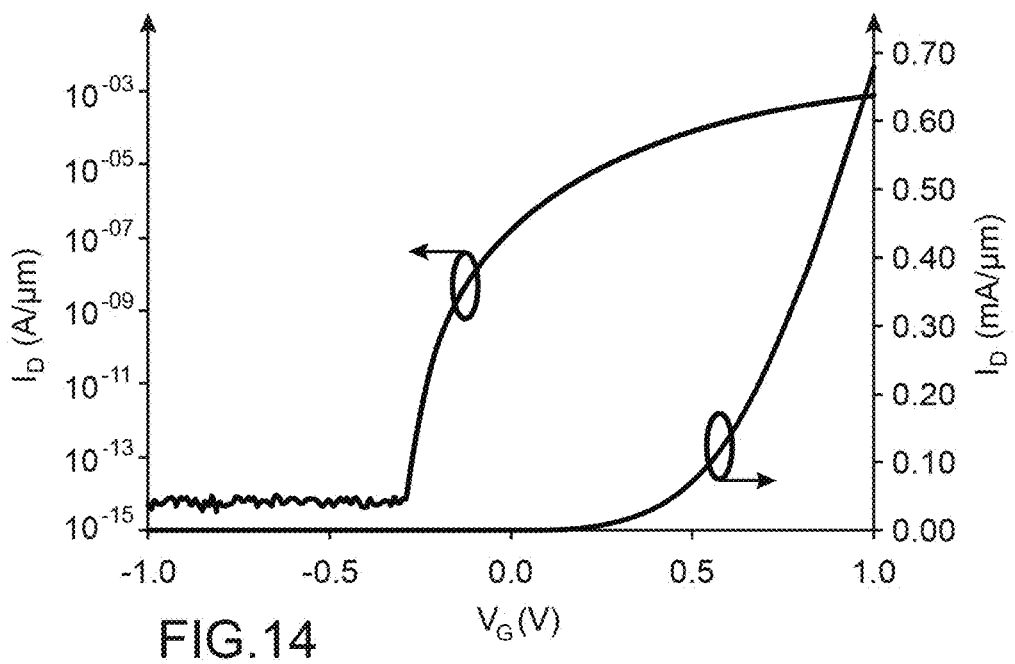
FIG. 14 shows the characteristic $I_D(V_{GS})$ of a forward biased n-TFET.

The cell 100 according to this second embodiment comprises the same elements as those previously described for the cell 100 of the FIG. 8. However, the TFETs 102, 104 are here designed such that during a reverse biasing, in the hump region, the $I_D$ current is not null even if $V_{GS}$ is equal to 0. The characteristic $I_D(V_{DS})$ of such reverse biased n-TFET, for different values of $V_{GS}$ (from 1V to 0V), is shown in FIG. 13. The characteristic $I_D(V_G)$ for such n-TFET in forward biasing condition is shown in FIG. 14. Such TFETs can be made in accordance with the information given in the documents C. ANGHEL et al., "30-nm Tunnel FET with improved performance and reduce ambipolar current", IEEE Transactions on Electron Devices, 2011.

In addition, instead of having two different bias voltages applied on the gates of the TFETs 102, 104, a single bias voltage called "Bias" is applied on the gate of the n-TFET 102 and on the gate of the p-TFET 104.

As for the cells 100 previously described in relation with FIGS. 4 and 8, during a retention mode of the cell 100 according to this second embodiment, TFETs 102, 104 are reverse biased with $0 < V_D - V_S \leq 0.6$ V. In addition, the bias voltage Bias is kept between $V_D$ and $V_S$ such that both devices get sufficient gate drive for hump, that is such that $V_{GS}$ is enough to have a conduction current created by band-to-band tunneling (however, this is always the case if the TFETs 102, 104 are designed such that the $I_D$ current is not null even if $V_{GS}$ is equal to 0).

The characteristic $I_D(V_{Qint})$ shown on FIG. 5 corresponds to the characteristic obtained for this cell 100 when the signal Bias is kept at 0 V.

During the retention mode, for a cell supply ($V_D - V_S$) of 0.6V, storage node 106 will be discharged through the n-TFET 102 for 0 V<Qint<100 mV till Qint=0 V. Similarly, storage node 106 will be charged by the p-TFET 104 for 0.5 V<Qint<0.6 V, similarly to the cell 100 previously disclosed in relation with FIG. 8. This results in latch behavior with either '0' stored on the n-TFET 102 or '1' stored on the p-TFET 104.

Unlike 6T-SRAM cell, cell 100 stability during read operation is similar to retention because storage node 106 is isolated during read operations. For successful write, Qint should reach within hump voltage range, then hump current will complete the write by charging the node storage 106 to supply voltage or discharging the node storage 106 to ground. Therefore, noise margin (here equal to around 100 mV) for write is also defined by hump width.

In order to write in the cell 100, $V_D$ and $V_S$ supply voltages are swapped to make $V_S > V_D$. TFETs 102, 104 are thus forward biased and behave like FETs and the gate bias is controlled to make either n-TFET 102 or p-TFET 104 weaker and other one stronger depending on the value to be written in the storage node 106 of the cell 100. For writing '0', Bias is pulled up to increase the gate drive of n-TFET 102 and to reduce the gate drive of p-TFET 104; thus n-TFET 102 will discharge the node 106 to voltage on the value of $V_S$. Similarly for writing '1', Bias is pulled down to increase the gate drive of p-TFET 104 and to reduce the gate drive of n-TFET 102; therefore, the p-TFET 104 will charge the node 106 to the value of the supply voltage $V_D$.

Figure 15:
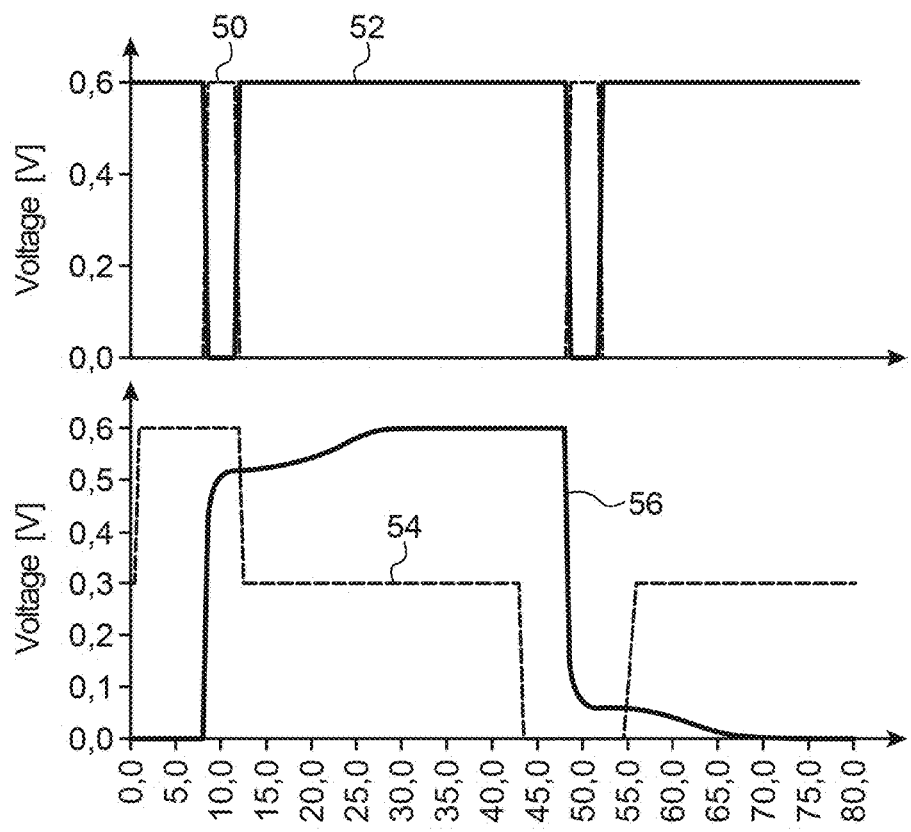
FIG. 15 shows waveforms of signals of the SRAM memory bit cell according to the second embodiment and during writing operations.

Waveforms for writing '0' and '1' are shown in FIG. 15. On this figure, the reference 50 corresponds to the supply voltage $V_S$ (dotted line) and the reference 52 corresponds to the supply voltage $V_D$. The reference 54 corresponds to the bias voltage Bias and the reference 56 corresponds to potential Qint.

Read operation is done with single ended read scheme using RWL 112 and RBL 110 as previously disclosed. The waveforms for a read operations are similar to those shown in FIG. 7.

In view of the above described behavior of the cell 100 according to the second embodiment, the operating of the cell 100 in the different modes (retention, write and read) needs the use of only three different voltage values to be used for $V_D$, $V_S$, and Bias. These values may be called GND, VDD/2 and VDD and are such that:

GND<VDD/2<VDD.

The value VDD/2 can be replaced by another value which is between GND and VDD.

The use of these voltages for the different signals of the cell 100 of the second embodiment during retention, read and write operations are shown in the table below.

|  | $V_D$ | $V_S$ | Bias | RWL 112 | RBL 110 |
|---|---|---|---|---|---|
| Retention | VDD | GND | VDD/2 | VDD | VDD |
| Write-1 | GND | VDD | VDD | VDD | VDD |
| Write-0 | GND | VDD | GND | VDD | VDD |
| Read | VDD | GND | VDD/2 | GND | Read value |

As an example, these voltages may have the following values:

| GND | VDD/2 | VDD |
|---|---|---|
| 0 V | 0.3 V | 0.6 V |

The cell 100 of the FIG. 12 is intended to be used with other similar bit cells in order to form a memory bit cells array, as the memory cell array 1000 shown in FIG. 9. In this array, Bias is routed vertically and the value to be written in each cell is decided by the value of Bias.

With the cell 100 of the FIG. 12, a memory having an architecture similar to that of the memory 2000 shown in FIG. 10 can be made.

With the cell 100 of the FIG. 12, a cell array of 64×32 (2 Kb) size may be done with a cell size equal to 0.10 µm²/bit with standard logic design rules.

As for the cells previously described, a comparison of energy consumption in various modes and bit cell area is shown in the table below (these values are experimental results specific to a technology, design rules and design, and may change for different sizing, technology and design rules).

| Cell | VDD (V) | WL$_{pulse}$ Read (ns) | WL$_{pulse}$ Write (ns) | E$_{READ}$ (fJ/ acc.) | E$_{WRITE}$ (fJ/ acc.) | E$_{AVG}$ (fJ/ acc.) |
|---|---|---|---|---|---|---|
| 8T-TFET | 1 | 0.26 | 1.10 | 28.5 | 61.0 | 44.8 |
| 3T-TFET 100 | 0.45 | 15 | 15 | 1.22 | 2.06 | 1.64 |
| 3T-TFET 100 | 0.6 | 1.961 | 8.03 | 2.18 | 3.66 | 2.92 |
| 6T-CMOS | 1.2 | 7 ns (access time for the full memory) | | N.A. | N.A. | 25 µW/ MHz |

| Cell | I$_{LEAK}$ Active (pA/bit) | I$_{LEAK}$ STBY (pA/bit) | Area/Bitcell (µm²) |
|---|---|---|---|
| 8T-TFET | 25.5 | 5.00 | 0.336 |
| 3T-TFET 100 | 5.72 | 0.1 | 0.108 |
| 3T-TFET 100 | 5.72 | 17 | 0.108 |
| 6T-CMOS | N.A. | 27.0 | 2.04 |

During standby, total leakage is coming from cell array, thus TFET memory leakage is much lower than CMOS memories. Read/Write speed and dynamic power consumption is improved because of low capacitances on supply nodes and on RWL 112.

Figure 16:
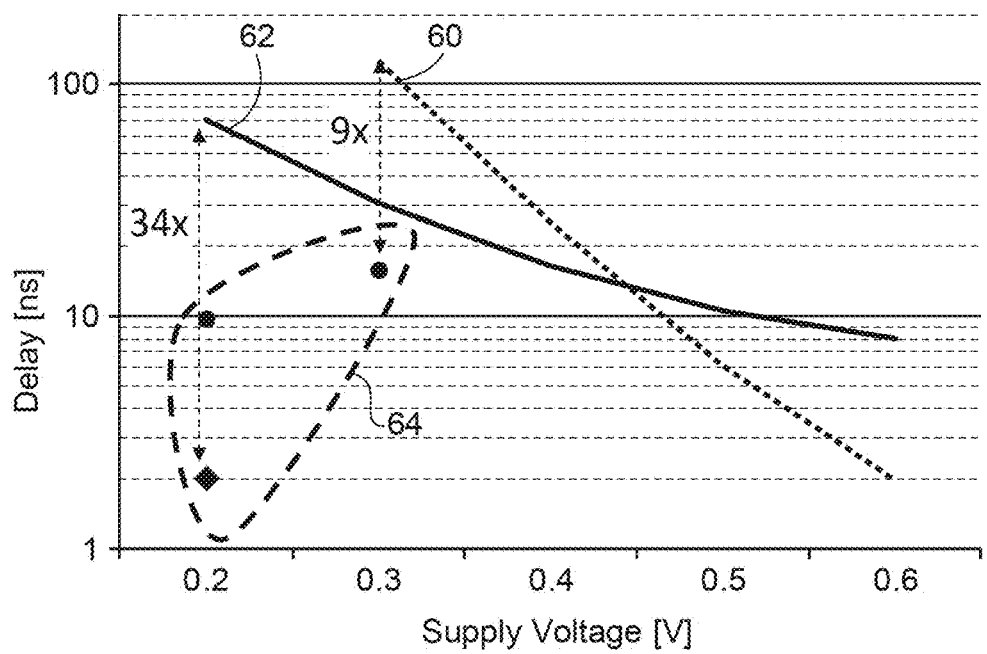
FIG. 16 shows the read and write performances of a SRAM memory bit cell according to the second embodiment.

Read (reference 60) and write (reference 62) minimum wordline pulse width (WLPcrit) is shown in FIG. 16. For sub-0.5 V voltage of operation, cell leakage is <0.1 fA/bit because either one of TFETs 102, 104 is always reverse biased. Above 0.5 V supply, the speed is improved at the cost of higher leakage due to increasing TFET reverse current.

As shown in FIG. 16, the read and write speed can be increased by using assist techniques for low voltage operation (see results surrounded by dotted lines 64). Since the cell data storage node 106 is isolated from RBL 110 and bias voltages of TFETs 102, 104, negative read wordline (NRWL) can be used to increase read speed without impacting the cell stability. Similarly for write, speed can be increased by boosting bias voltages. Read performance is improved more than 8× by using NRWL with −100 mV and −150 mV for 0.3 V and 0.2 V supplies, respectively. Similarly for write, a boost of 100 mV on bias voltage is used below 0.3 V cell supply to improve the write speed by more than 34×.

Overall performance is estimated including periphery delays in row decoder, drivers and sensing. Proposed design supports overall read speed from 204 MHz to 3.16 MHz and write speed from 50 MHz to 13 MHz for 0.6 V to 0.3 V supply voltage.

Thus the cell 100 according to this second embodiment enables to operate with only three different voltages, compared to the five voltages required for the operating of the cell 100 according to the first embodiment, with however the drawback of a slower reading and writing of the cell compared to the first embodiment.

In the first and second embodiment previously disclosed, the cell 100 comprises a TFET 108 forming the read port of the cell 100. However, other type of read port comprising TFETs and/or CMOS transistors can be used instead of a single TFET.

Figure 17:
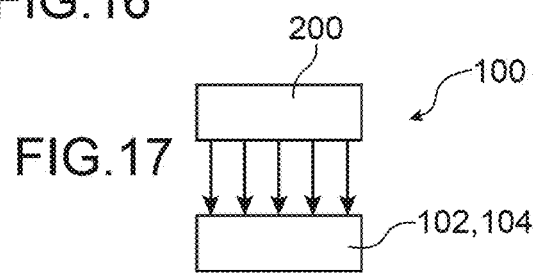
FIG. 17 shows a SRAM memory bit cell according to a particular embodiment.

FIG. 17 shows the bit cell 100 comprising a control circuit 200 providing the different signals ($V_D$, $V_S$, Bias, or Bias102 and Bias 104, voltages for the RBL 110 and RWL 112) to the elements of the bit cell 100, especially the TFETs 102, 104.

Figure 18:
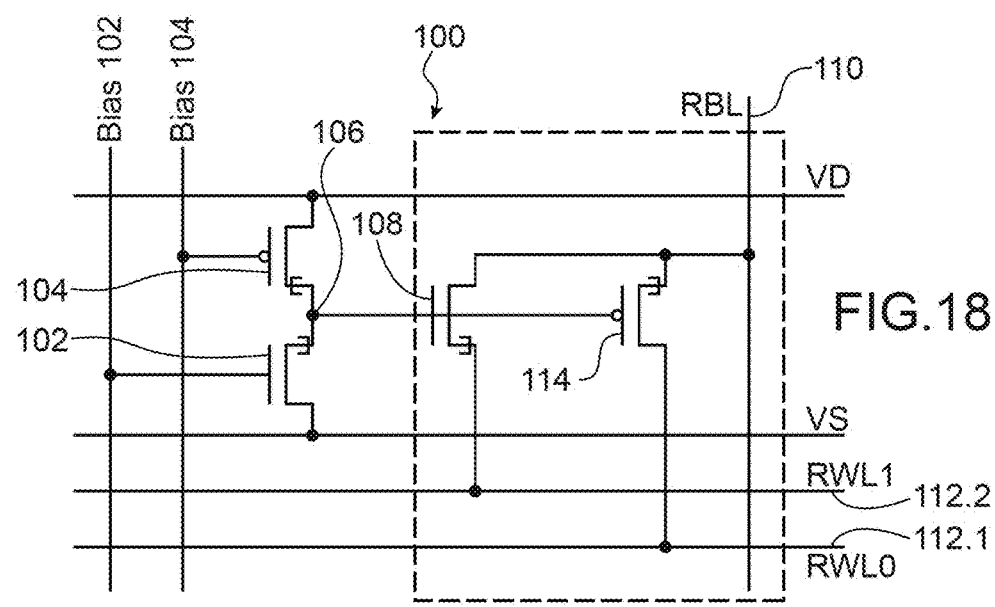
FIG. 18 shows a SRAM memory bit cell according to a variant of the first embodiment.

FIG. 18 shows a SRAM memory bit cell 100 according to a variant of the first embodiment.

According to this variant, the bit cell 100 comprises, in addition to the first read TFET 108, a second read TFET 114. When the first read TFET 108 is a n-TFET, the second read TFET 114 is a p-TFET. When the first read TFET 108 is a p-TFET, the second read TFET 114 is a p-TFET.

In the example shown in FIG. 18, the first read TFET 108 is a n-TFET and the second read TFET 114 is a p-TFET. The drain of the second read p-TFET 114 is connected to a first RWL0 (reference 112.1) and the source of the read n-TFET 108 is connected to a second RWL1 (reference 112.2). The drain of the first read n-TFET 108 and the source of the second p-TFET 114 are connected to the RBL 110.

The structure of such bit cell 100 enables to make a CAM (Content Addressable Memory). The values apply on the RWL 112.1 and 112.2 depend on the value of the searched data. In the example shown in FIG. 18, if the searched data corresponds to '1', the value applied on RWL0 112.1 is low ('0') and the value applied on RWL1 112.2 is high ('1'). If the searched data corresponds to '0', the value applied on RWL0 112.1 is high and the value applied on RWL1 112.2 is low. In case of mismatch between the searched value and the stored value in the storage node 106, the value on RBL 110 is discharged.

In the above description, the data concerning the leakage, area, power and speed are experimental results which can change with different sizing, implementation and technologies. In addition, the different example values given for the different voltages can be different according to the sizing, implementation and technologies used.

The invention claimed is:

1. SRAM memory bit cell comprising at least:
   a n-TFET and a p-TFET;
   a storage node formed by the connection of a first electrode of the n-TFET to a first electrode of the p-TFET, the first electrodes being a drain or a source of the respective TFET devices;
   a control circuit able to apply supply voltages on second electrodes of the n-TFET and p-TFET, and to supply bias voltages on the gates of the n-TFET and p-TFET, the second electrodes being a source the respective TFET devices when the first electrode is a drain of the respective TEFT devices, and the second electrode being a drain of the respective of the TFET devices when the first electrode is a source of the respective TFET devices;
   wherein the control circuit is configured to provide:
   during a retention of a bit stored in the storage node, supply and bias voltages reverse biasing the n-TFET and p-TFET in a state wherein a conduction current is obtained by band-to-band tunneling in the n-TFET and p-TFET; and
   during a writing of a bit in the storage node, supply and bias voltages forward biasing the n-TFET and p-TFET and such that one of the n-TFET and p-TFET is in OFF state and that the other of the n-TFET and p-TFET is in ON state.

2. The SRAM memory bit cell according to claim 1, wherein, during the writing of a bit in the storage node, the control circuit applies a supply voltage on the second electrode of the n-TFET that is equal to the value of the supply voltage applied on the second electrode of the p-TFET during the retention of a bit stored in the storage node, and the control circuit applies a supply voltage on the second electrode of the p-TFET that is equal to the value of the supply voltage applied on the second electrode of the n-TFET during a retention of a bit stored in the storage node.

3. The SRAM memory bit cell according to claim 1, wherein the control circuit is able to provide different bias voltages on each of the gates of the n-TFET and p-TFET.

4. The SRAM memory bit cell according to claim 3, wherein, during the retention of a bit stored in the storage node, the control circuit applies a bias voltage on the gate of the n-TFET that is higher than the value of the supply voltages applied on the second electrodes of the n-TFET and p-TFET, and the control circuit applies a bias voltage on the gate of the p-TFET that is lower than the value of the supply voltages applied on the second electrodes of the n-TFET and p-TFET.

5. The SRAM memory bit cell according to claim 3, wherein, during the writing of a bit in the storage node:
   when the first electrode is a drain of the respective TEFT devices and the second electrode is a source of the respective TEFT devices, the control circuit applies a bias voltage on the gate of the n-TFET that is between the values of the supply voltages applied on the second electrodes of the n-TFET and p-TFET if the bit is "1" and the control circuit applies a bias voltage on the gate of the p-TFET that is between the values of the supply voltages applied on the second electrodes of the n-TFET and p-TFET if the bit is "0";
   when the first electrode is a source of the respective TEFT devices and the second electrode is a drain of the respective TEFT devices, the control circuit applies a bias voltage on the gate of the p-TFET that is between the values of the supply voltages applied on the second electrodes of the n-TFET and p-TFET if the bit is "1" and the control circuit applies a bias voltage on the gate of the n-TFET that is between the values of the supply voltages applied on the second electrodes of the n-TFET and p-TFET if the bit is "0".

6. The SRAM memory bit cell according to claim 1, wherein, when the first electrode is a source of the respective TEFT devices and the second electrode is a drain of the respective TEFT devices, the control circuit applies a bias voltage, the control circuit is able to provide a single bias voltage on the gates of the n-TFET and p-TFET.

7. The SRAM memory bit cell according to claim 6, wherein, during the retention of a bit stored in the storage node, the control circuit applies a bias voltage on the gates of the n-TFET and p-TFET that is between the values of the supply voltages applied on the second electrodes of the n-TFET and p-TFET.

8. The SRAM memory bit cell according to claim 6, wherein, during the writing of a bit in the storage node, the control circuit applies a bias voltage on the gates of the n-TFET and p-TFET that is equal to the highest value among the values of the supply voltages applied on the second electrodes of the n-TFET and p-TFET if the bit is "1", and the control circuit applies a bias voltage on the gates of the n-TFET and p-TFET that is equal to the lowest value among the values of the supply voltages applied on the second electrodes of the n-TFET and p-TFET if the bit is "0".

9. The SRAM memory bit cell according to claim 1, further comprising:
 a read port having a first electrode connected to the storage node;
 a read bit line connected to a second electrode of the read port;
 a first read word line connected to a third electrode of the read port;
 and wherein the control circuit is configured to apply a pre-charge voltage on the read bit line and a read control voltage on the first read word line.

10. The SRAM memory bit cell according to claim 9, wherein the read port comprises a first read TFET, the first electrode corresponding to the gate of the first read TFET, the second electrode corresponding to one of the source and drain of the first read TFET and the third electrode corresponding to the other one of the source and drain of the first read TFET.

11. The SRAM memory bit cell according to claim 10, wherein the read port further comprises a second read TFET having a conductivity opposite to that of the first read TFET, wherein the gate of the second read TFET is connected to the storage node, one of the source and drain of the second read TFET is connected to the read bit line and the other one of the source and drain of the second read TFET is connected to a second read word line.

12. A SRAM memory bit cells array comprising several SRAM memory bit cells according to claim 9, wherein the SRAM memory bit cells are arranged according to an array of several lines and several columns, and wherein:
 each read bit line is common to all SRAM memory bit cells belonging to a same column of the array;
 each read word line is common to all SRAM memory bit cells belonging to a same row of the array;
 when the control circuit is able to provide different bias voltages on each of the gates of the n-TFET and p-TFET, the gates of the n-TFET of all SRAM memory bit cells belonging to a same column of the array are connected together and the gates of the p-TFET of all SRAM memory bit cells belonging to a same column of the array are connected together; or
 when the control circuit is able to provide a single bias voltage on the gates of the n-TFET and p-TFET, the gates of the n-TFET and p-TFET of all SRAM memory bit cells belonging to a same column of the array are connected together.

13. The SRAM memory device comprising several SRAM memory bit cells arrays according to claim 12, wherein the control circuit is common to the several SRAM memory bit cells arrays and comprises several CMOS transistors.

* * * * *